United States Patent
Yeoh et al.

(10) Patent No.: US 9,450,636 B2
(45) Date of Patent: Sep. 20, 2016

(54) INTRINSICALLY SAFE AUDIO POWER CURRENT CIRCUIT AND DEVICE USING SAME

(71) Applicant: MOTOROLA SOLUTIONS, INC, Schaumburg, IL (US)

(72) Inventors: Chen Kok Yeoh, Bukit Mertajam (MY); Friedrich Josef Bollmann, Brandenburg (DE); Geng Xiang Lee @ Titus Lee, Pulau Pinang (MY); Joo Yih See, Kedah (MY)

(73) Assignee: MOTOROLA SOLUTIONS, INC., Schaumburg (IL)

( * ) Notice: Subject to any disclaimer, the term of this patent is extended or adjusted under 35 U.S.C. 154(b) by 0 days.

(21) Appl. No.: 14/585,281

(22) Filed: Dec. 30, 2014

(65) Prior Publication Data

US 2016/0191104 A1    Jun. 30, 2016

(51) Int. Cl.
| | |
|---|---|
| *H04B 1/38* | (2015.01) |
| *H04B 1/40* | (2015.01) |
| *H03F 3/183* | (2006.01) |
| *H03F 1/52* | (2006.01) |
| *H03F 3/21* | (2006.01) |

(52) U.S. Cl.
CPC ........ *H04B 1/40* (2013.01); *H03F 1/52* (2013.01); *H03F 3/183* (2013.01); *H03F 3/21* (2013.01); *H03F 2200/03* (2013.01)

(58) Field of Classification Search
CPC ........... H04B 1/40; H03F 3/183; H03F 1/52; H03F 3/21
USPC ......... 455/3.06, 73, 90.2, 133, 191.3, 194.2, 455/127.1; 381/120, 55, 59, 77, 96
See application file for complete search history.

(56) References Cited

U.S. PATENT DOCUMENTS

| | | | |
|---|---|---|---|
| 3,549,808 A | 12/1970 | Smith | |
| 5,301,082 A | 4/1994 | Stolarczyk et al. | |
| 7,485,944 B2 | 2/2009 | Kothandaraman et al. | |
| 7,592,719 B2 | 9/2009 | Hoopes | |
| 7,656,695 B2 | 2/2010 | Rahman | |
| 7,773,358 B2 | 8/2010 | Neesgaard et al. | |
| 8,401,500 B1* | 3/2013 | Bauder | G06F 1/26 330/127 |
| 8,446,210 B2 | 5/2013 | Liu | |
| 8,750,525 B2 | 6/2014 | Martz et al. | |
| 2007/0194942 A1 | 8/2007 | Darr | |
| 2011/0227645 A1* | 9/2011 | Mayuzumi | H03F 3/217 330/251 |

FOREIGN PATENT DOCUMENTS

| | | |
|---|---|---|
| EP | 605356 B1 | 6/1998 |
| EP | 2133146 A1 | 12/2009 |
| WO | 2014075111 A1 | 5/2014 |

* cited by examiner

*Primary Examiner* — Tuan Pham
(74) *Attorney, Agent, or Firm* — Scott M. Garrett; Barbara R. Doutre

(57) ABSTRACT

An intrinsically safe audio power circuit includes redundant electronic fuses disposed between the power input of an audio power amplifier and the battery source of the portable two-way radio device. The electronic fuse circuits are connected in series with each other, and each electronic fuse circuit includes a series switch transistor that can shut off the flow of current between the battery and the audio power amplifier. Each electronic fuse circuit also includes a current sense portion, and when the current through the electronic fuse circuits reaches a current threshold, it will shut off its series switch transistor using an active bias circuit in order to ensure sufficiently rapid shut off.

21 Claims, 5 Drawing Sheets

INTRINSICALLY SAFE AUDIO POWER CURRENT CIRCUIT AND DEVICE USING SAME

BACKGROUND OF THE INVENTION

Many portable electronic devices, such as portable two-way radio devices, are designed with audio output being an important consideration. In a typical audio circuit, the audio amplifier directly drives a speaker. While this is a conventional design approach for most applications, it poses some issues for applications where a device is to be used safely in an atmosphere including volatile components. Such potentially hazardous conditions can be found, for example, in chemical processing operations, mining, petroleum refineries, and so on. In the event such conditions arise, people in such areas may need to communicate, and accordingly, communication devices for use in such conditions need to be designed to be "intrinsically safe" so as to avoid ignition of volatile constituents that may be dispersed in the atmosphere in an area around the device.

The term "intrinsic safety" refers to the design of devices so that that they are intrinsically incapable of causing ignition of volatile atmospheric constituents (e.g. gases, fumes, dust). To accomplish this there are several considerations that must be addressed, and among them are energy storage and the ability of a device component to reach a temperature that can cause ignition. Energy storage refers to, for example, the storage of charge in capacitors and the storage of magnetic flux in inductive components. In considering a given design for intrinsic safety it is assumed that storage components can experience faults (i.e. sudden short or open circuit conditions) which cause near-instant release of the energy stored in the component. Accordingly, the ability of a device to store energy must be such that a sudden release of energy cannot cause a sufficiently energetic event to cause ignition. Similarly, components are examined to determine their thermal response to fault conditions, and whether any individual component can achieve an ignition temperature.

The speaker, driven by the audio amplifier, includes an inductive coil which can store energy, and which also acts as a resistance. In order to avoid an unsafe level of energy storage under fault conditions, the current provided to the speaker coil must be limited. At the same time, the thermal properties of the speaker likewise necessitate a current limit in order to prevent the speaker coil from heating to an unsafe level in the event of a fault. A conventional technique for limiting current provided to the speaker coil is to insert a pair of fuses between the audio amplifier output(s) and the speaker coil. This presents a significant performance issue, however. Under intrinsically safe design conventions, a safety factor is applied to the rating of the fuses. That means it must be assumed that a fuse will allow an excess current by a given safety factor proportion above its rated current. Accordingly, fuses must be selected that limit current substantially below the "safe" current level (based on inductance and thermal considerations). Therefore the maximum current that can be applied to the speaker by the audio amplifier in normal operation is substantially below the determined safe current. Furthermore, the series resistance of the fuses attenuate audio power delivered to the speaker. As a result, the audio power that can be output by the speaker is substantially reduced. Users of intrinsically safe radio devices often complain about the lack of audio output of such devices.

Accordingly, there is a need for an intrinsically safe audio power circuit that avoids the problems associated with series fuses in driving an audio speaker of the portable radio device.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
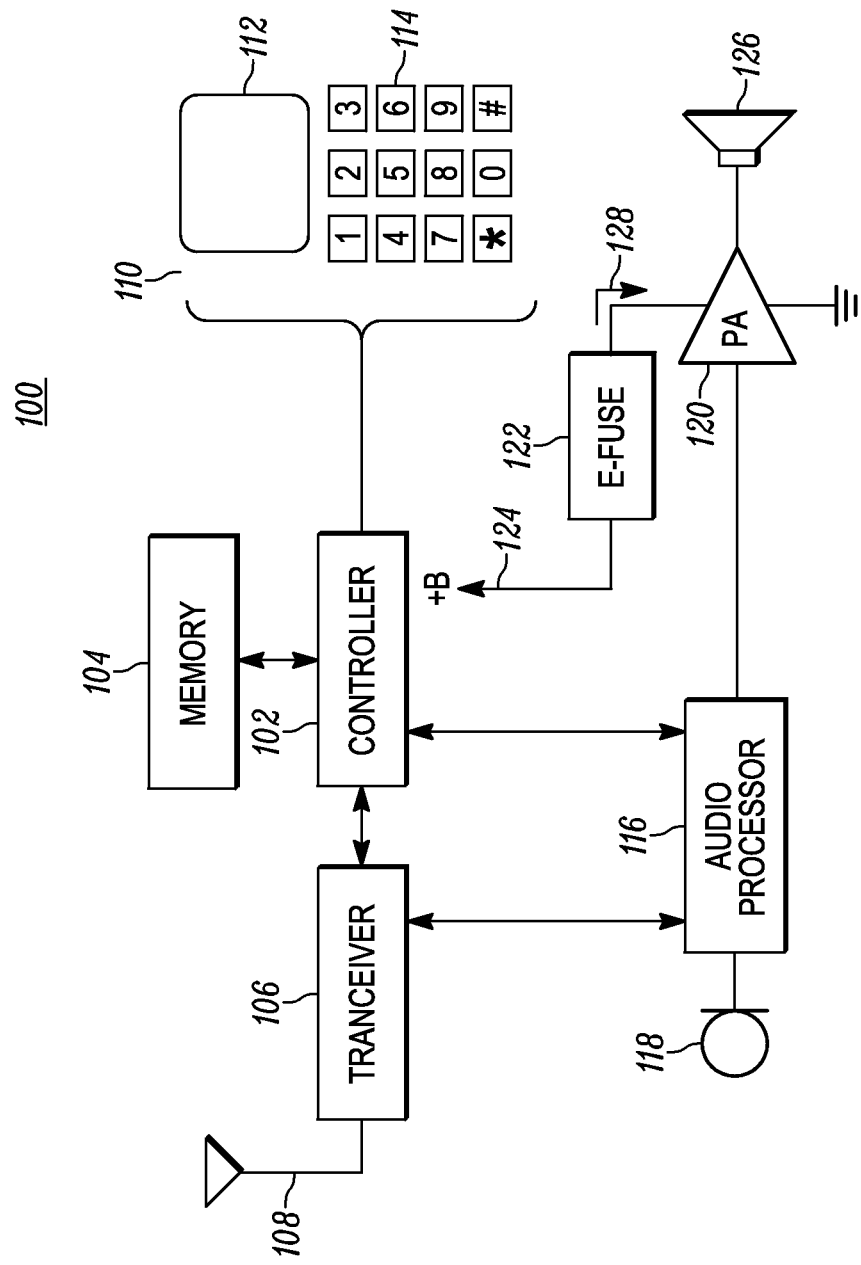
FIG. 1 is a block diagram of a radio device including an intrinsically safe audio power circuit in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Embodiments include an intrinsically safe audio power circuit for a portable radio device that includes an audio amplifier circuit having a power input, and first and second electronic fuse circuits coupled in series between the power input of the audio amplifier circuit and an unregulated battery positive source. Power for the audio power amplifier circuit is provided through the first and second electronic fuse circuits. The electronic fuse circuits are redundant, and each electronic fuse circuit senses current drawn from battery by the audio amplifier circuit. Under normal operation the electronic fuse circuits remain on, allowing conduction without any substantial resistance between the battery and the audio amplifier circuit. In the event of a fault condition, where the current demand from the audio amplifier circuit exceeds a current threshold, one of the electronic fuse circuits will trip, opening the conduction path between the battery and the audio amplifier circuit (i.e. a high impedance). The electronic fuse circuit will remain off or open circuited until the battery source is disconnected from the audio power circuit.

FIG. 1 is a block diagram of a radio device 100 including an intrinsically safe audio power circuit, in accordance with some embodiments. The radio device can be a portable two-way radio device that uses "push to talk" operation, where a user can press a button and almost instantly begin talking, assuming a radio channel is available. The radio device 100 includes a controller 102 which can execute instruction code that is instantiated in a memory 104. The instruction code causes the controller to carry out operations and functions, and implement operating features as designed. A radio transceiver 106 includes a transmitter path and a receiver path, and includes all of the necessary support circuitry for frequency generation and synthesis, modulation and demodulation, filtering, amplifying, and gain control of signals. An antenna 108 matches the transceiver to the transmission medium (i.e. air) in order to effectively transmit and receive radio signals over the air. A user interface 110 includes functions and components that allow a user to operate the radio device 100 through input, and selection of various settings, as well as to receive information from the radio device 100. For example, the user interface can include a graphical display 112 and a key pad 114, as well as other buttons and knobs, as provided. The graphical display 112 allows the radio device 100 to present information visually to a user (i.e. in text, pictures, etc.). The keypad 114 allows a user to enter information, selection options, operate soft menu functions, and so on.

Since the primary purpose of the radio device 100 is voice communication, it further includes an audio processor 116. The audio processor 116 prepares and formats audio information that is received via a microphone 118 for transmission by the transceiver 106. The transceiver 106 also provides to the audio processor 116 audio information that is received in radio signals via the antenna 108. Received audio signals are converted into an analog form and amplified by an audio amplifier circuit 120 to a selected audio power level, and played over a speaker 126. The audio amplifier circuit 120 is powered from a battery source 124 through an electronic fuse circuit 122. The electronic fuse circuit 122 is designed to allow the output of the audio amplifier 120 to meet intrinsically safe standards by limiting current drawn by the audio amplifier circuit 120 or other circuitry in case of a fault condition (e.g. a short circuit or other excessive load). The electronic fuse circuit 122 senses current 128 provided by the battery source 124. Under normal, non-fault operation, while the electronic fuse circuit 122 has not been tripped and the current 128 is below a current threshold that is determined to be at an intrinsically safe level based on the design of the speaker 126, the electronic fuse operates essentially as a closed switch, allowing conduction without any substantial resistance. However, if the current 128 exceeds the intrinsically safe current threshold, the electronic fuse circuit 122 will turn off, becoming a very high impedance, acting essentially as an open circuit. Furthermore, the electronic fuse circuit 122 can latch once it is tripped such that the battery source 124 must be disconnected before the electronic fuse circuit 122 will reset. The latch effect operates even if the load that caused the electronic fuse circuit 122 to trip is removed, until the battery source 124 is disconnected. The battery source 124 is generally the unregulated voltage provided at the positive terminal of the battery used to power the radio device 100.

Figure 2:
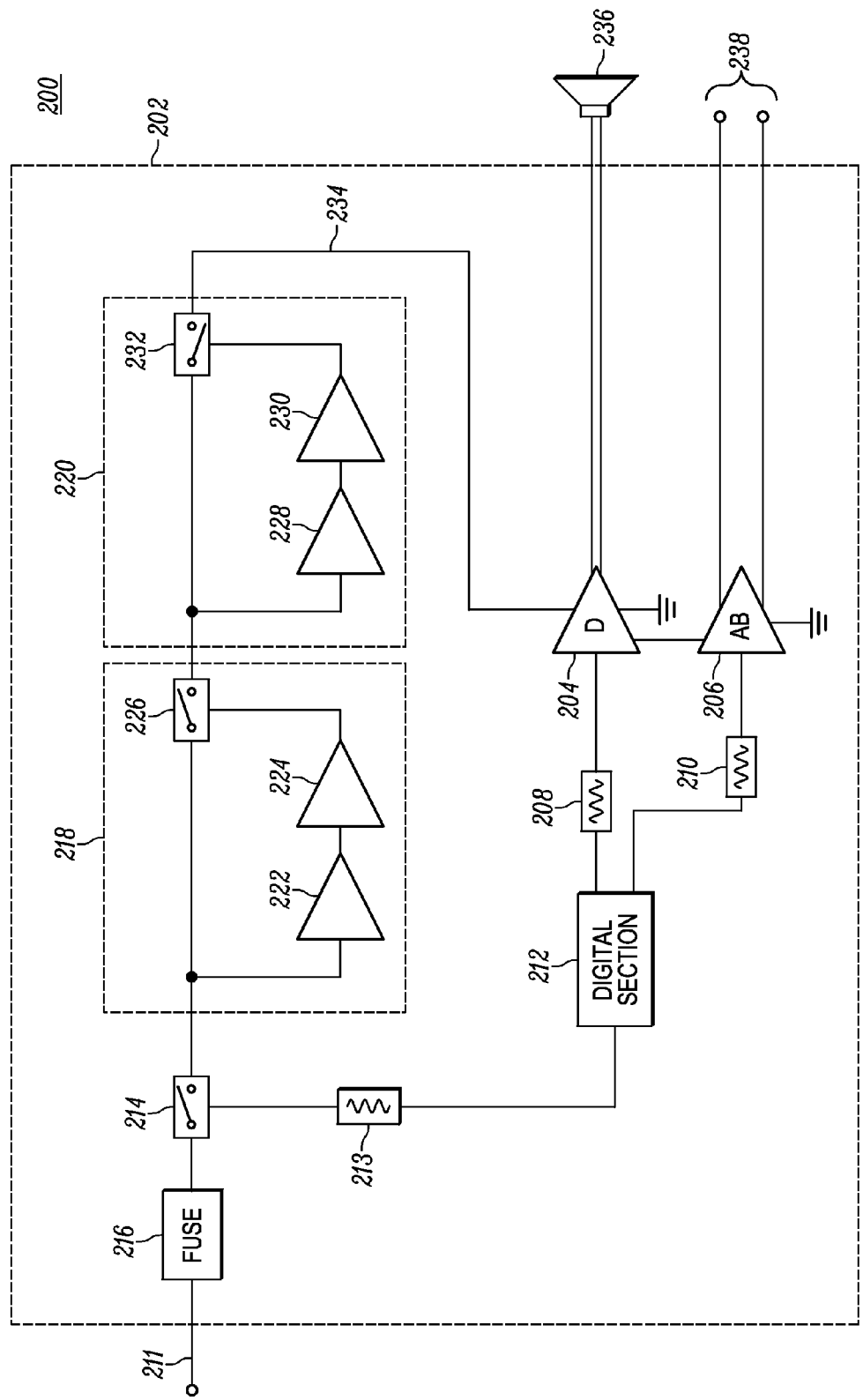
FIG. 2 is a block schematic diagram of an intrinsically safe audio power circuit in accordance with some embodiments.

FIG. 2 is a block schematic diagram of an intrinsically safe audio power circuit 200 in accordance with some embodiments. An audio amplifier circuit 202 includes one or more audio power amplifiers 204, 206 which each selectively amplify an audio signal that is provided by a digital section 212 of an audio processor. The digital section 212 produces analog audio signals from digital audio signal information received from the radio transceiver, and provides the analog audio signals to one or more of the audio power amplifiers 204, 206. Input resistors 208, 210, prevent excessive current through the audio power amplifiers 204, 206, respectively, in accordance with intrinsic safety guidelines, to prevent excessive current from the digital section 212 reaching the speaker 236 or other audio termination device (e.g. that would be connected at 238) in the event of a fault condition.

The audio power amplifiers 204, 206 are powered from an unregulated battery positive source 211, which is essentially the raw battery output. Current from the battery can pass through a resistive fuse 216, which opens at a selected current level, and a power control switch 214 which can be controlled by the digital section 212 in response to the radio device being turned on or off by the user. A protection device 213 can provide resistance between the power control switch 214 and the digital section according to intrinsically safe standards. In addition, a first electronic fuse circuit 218 and a second electronic fuse circuit 220 are connected in series between the unregulated battery positive source 211 and the power inputs of the audio power amplifiers 204, 206. Each of the electronic fuse circuits 218, 202 include a respective current sense portion 222, 228, a respective series switch transistor 226, 232, or suitable equivalent switching devices, and a respective drive circuit 224, 230. Each current sense portion 222, 228 senses current through its respective series switch transistor 226, 232 and generates a current sense signal that is provided to the respective drive circuit 224, 230. The drive circuit compares the current sense signal to a reference voltage that corresponds to a current threshold (i.e. the intrinsically safe current level). While the current being drawn by the audio power amplifier or amplifiers 204, 206 from the battery is below the current threshold, the drive circuits 224, 230 maintains their respective series switch transistors 226, 232 on (i.e. conducting). If the current exceeds the current threshold, the drive circuits (either one of them), will drive its respective series switch transistor 226, 232 off (i.e. non-conductive). Furthermore, the drive circuits 224, 230 can latch once tripped, so that even if the load (i.e. load on line 234) drops or ceases, the series switch transistor that is switched off remains off. Although the electronic fuse circuits 218, 220 are designed to be redundant (as typically required under intrinsically safe design guidelines), component tolerances will cause one or the other to trip at a slightly lower current level. Being redundant, however, it does not matter which electronic fuse circuit trips, so long as they are both capable of preventing a current exceeding the intrinsically safe current level from being drawn by the audio power amplifiers 204, 206.

The current sense portions 222, 228 and drive circuits 224, 230 are powered by the battery source 211, and in order to reset a tripped (switched off) electronic fuse circuit 218, 220 the battery source must be disconnected, such as by, for example, removing the battery from the radio device. The fuse action of the electronic fuse circuits 218, 220 is designed to operate in a rapid manner so as to limit the energy output by the electronic fuse circuits 218, 220 to a safe level, such as, for example, on the order of 20 micro Joules. By acting quickly, the electronic fuse circuits 218, 220 are allowed to replace the conventional series resistive fuses that are typically connected between the outputs of the audio power amplifier 204 and the speaker 236 to limit current and still meet intrinsically safe standards for energy storage and thermal requirements. By eliminating the conventional resistive fuses between the audio power amplifier 204 and the speaker 236 by instead using the electronic fuse circuits 218, 220, more power can be delivered to the speaker(s), increasing the audio sound pressure level of the resulting acoustic signal. A substantial gain in output sound pressure can be achieved using the electronic fuse circuits 218, 220 rather than the conventional resistive fuses between the audio power amplifier 204, 206 and the speaker 236, 238.

In embodiments where multiple audio power amplifiers 204, 206 are included, a first audio power amplifier 204 can drive an internal speaker 236 that is mounted in the radio device, and can be, for example, a class D power amplifier. A second audio power amplifier 206 can be used to drive an external speaker that can be connected to an audio connector 238, and can be, for example, a class AB power amplifier, although it will be appreciated by those skilled in the art that different classes of amplifiers can be used, depending on the particular audio application. The digital section 212 can route audio signals to either of the audio power amplifiers 204, 206 based on a selection by the user. To further comply with intrinsically safe guidelines, the audio amplifier circuit 202 can be encapsulated in a cured resin material. By encapsulating the components of the audio amplifier circuit 202 the component clearance distance required between components to meet intrinsically safe standards can be reduced.

Figure 3:
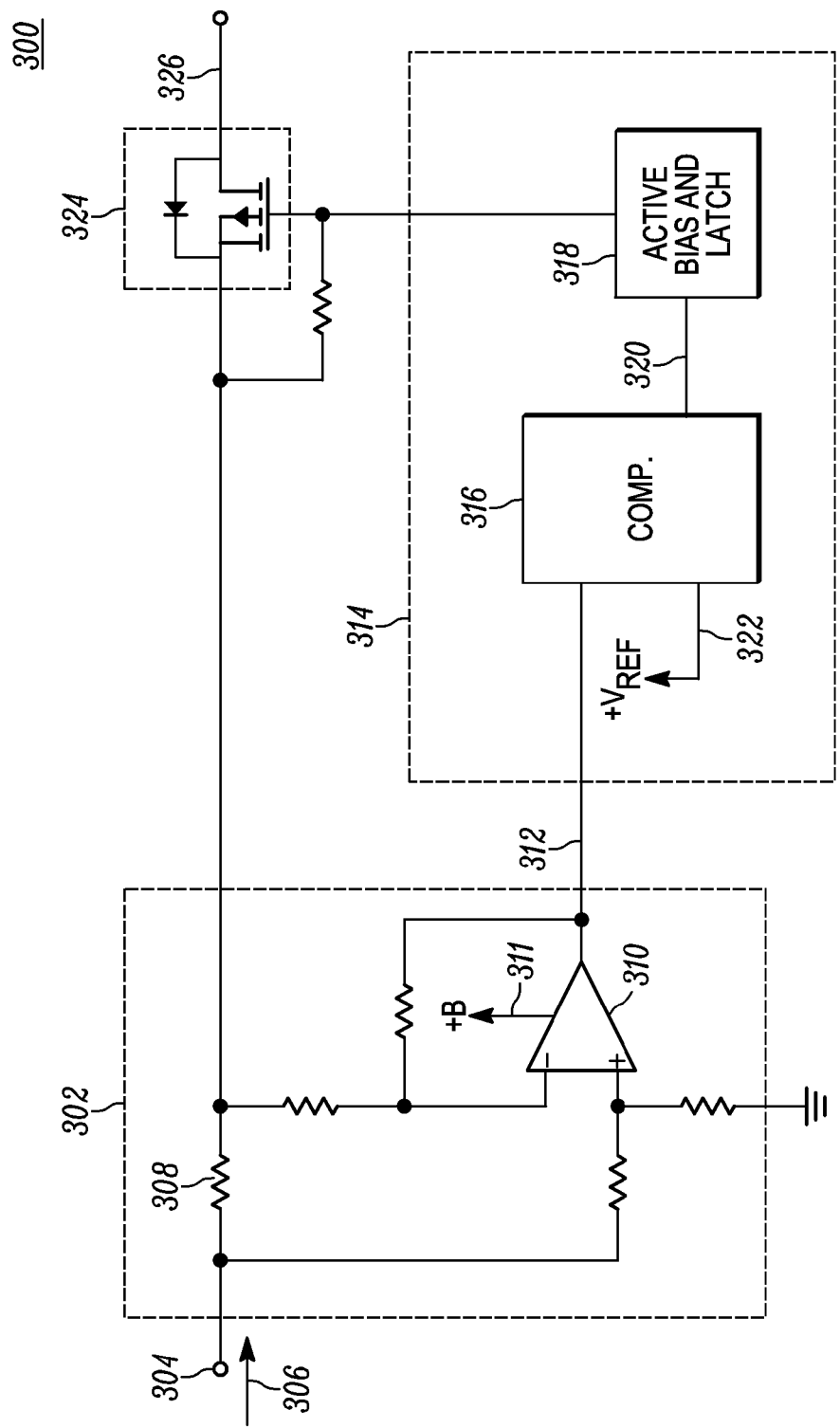
FIG. 3 is a block schematic diagram of an electronic fuse circuit in accordance with some embodiments.

FIG. 3 is a block schematic diagram of an electronic fuse circuit 300 in accordance with some embodiments. The electronic fuse circuit 300 is designed to act quickly in response to an excess current event, and to stay switched off even when the load that caused the excessive current event is removed. A current sense portion 302 senses current passing from an input 304 to an output 326 in the direction of arrow 306. The current passes through a sense resistor 308 and produces a voltage as a result. The sense resistor can be on the order of a 0.1 ohms or less. The voltage produced across the sense resistor can be provided to a current sense amplifier 310 that generates a current sense signal on line 312 that is proportional to the voltage across the current sense resistor 308. The current sense amplifier 310 has a power input 311 that is connected to the battery source, allowing it to remain powered in the event of either of the series switch transistors being opened.

The current sense signal on line 312 is provided to the driver circuit 314. The current flowing through the current sense resistor 308 also flows through the series switch transistor 324 (when it is on). The series switch transistor 324 can be a P-type metallic oxide semiconductor field effect transistor (MOSFET). The driver circuit control operation of the series switch transistor 324. Under non-fault conditions, the series switch transistor 324 is controlled to be in an "on" state, meaning minimum series resistance. Under a fault or other excessive current event where the current through the sense resistor exceeds the current threshold, the driver circuit shuts off the series switch transistor 324. The driver circuit 314 can include a driver comparator 316 that compares the current sense signal on line 312, output by the current sense amplifier 310, to a voltage reference 322 that corresponds to the current threshold at which the series switch transistor 324 should be opened. That is, the voltage reference 322 is set to be equal to the voltage produced at the output of the current sense amplifier 310 when the current through the current sense resistor 308 is at the current threshold. The current threshold is selected based on the particular application and design of the particular device, and specifically the speaker coil being used. The driver comparator 316 provides a comparator output 320 to an active bias circuit 318 that controls a bias of the series switch transistor 324 responsive to the output 320 of the driver comparator 316. The active bias circuit 318 drives the bias of the series switch transistor 324 using active switching, rather than merely making passive changes and allowing the bias to change in response. The active bias circuit 318, by actively driving the bias (e.g. the gate-source voltage) of the series switch transistor 324, reduces the switching time of the series switch transistor 324 compared to passively changing the bias, which allows the electronic fuse circuit 300 to act like a conventional resistive fuse with regard to response time, if not faster.

Figure 4:
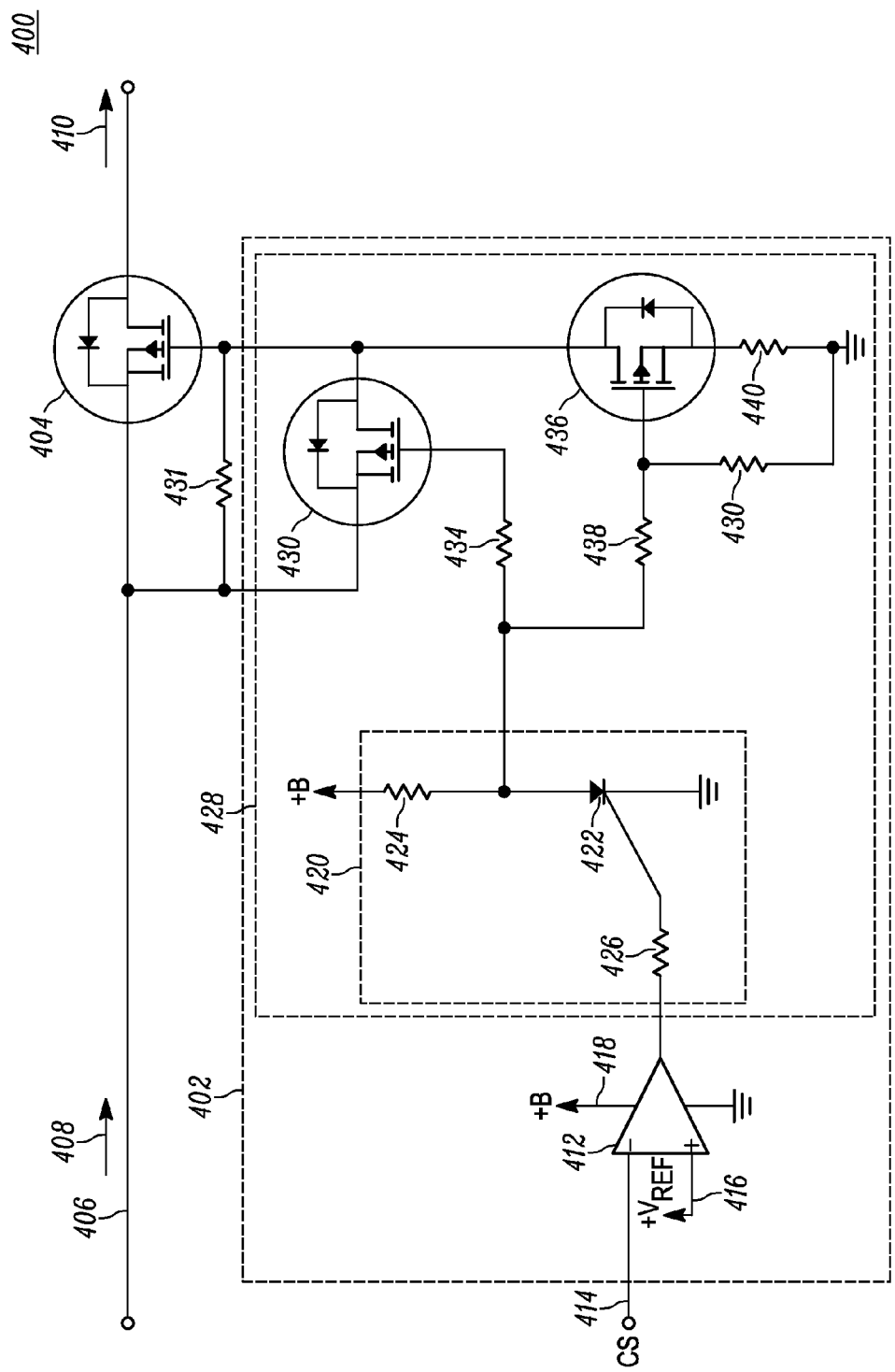
FIG. 4 is a schematic diagram of a portion of an electronic fuse circuit in accordance with some embodiments.

FIG. 4 is a schematic diagram of a portion of an electronic fuse circuit 400 showing an implementation of a driving circuit 402 in accordance with some embodiments. The driving circuit 402 includes the driving comparator 412 and the active bias circuit 428. As in FIG. 3, current passes from an input 406 in the direction of arrow 408, assuming series switch transistor 404 is on, from a source such as a raw battery voltage, which can be an unregulated battery positive source. Current 410 is provided to the audio amplifier circuit for powering the audio amplifier or amplifiers. A current sense signal 414 is fed to the inverting input of a driving comparator 412, which is compared to a voltage reference 416 that is provided to the non-inverting input, and which is at a voltage level that corresponds to a current threshold at which the electronic fuse circuit trips (i.e. shuts off series switch transistor 404). The driver comparator 412 is powered by the battery voltage 418.

The active bias circuit 428 includes a thyristor 422 that is driven by the output of the driving comparator 412 through resistor 426. The thyristor 422 is connected between the battery voltage and ground, in series with resistor 424. The node between the thyristor 422 and resistor 424 is used to switch the active bias circuit when the current threshold is exceeded (i.e. the magnitude of current 410). In a non-fault, operational state the series switch transistor is on, and the thyristor 422 is off. As a result, the voltage at the node between the thyristor 422 and resistor 424 is divided between resistor 424 and resistors 438 and 440 as no current passes through the thyristor, and that voltage is provided to a P-type driving MOSFET 430, which will be switched off as a result. N-type driving MOSFET 436, however, will be on, which pulls the gate of the series switch transistor 404 low (which is normally high due to pull up resistor 431), causing it to be on, as initially assumed.

When the current threshold is exceeded, however, the output of the driving comparator 412 is driven low, which sinks current through the thyristor 422, causing the thyristor 422 to turn on. As a result, the node between the thyristor 422 and resistor 424 will be driven to a lower voltage, which causes P-type driving MOSFET 430 to switch on, and N-type driving MOSFET 436 to switch off, and as a result, the bias of the series switch transistor 404 is driven high, causing the series switch transistor 404 to shut off.

When the series transistor switch 404 is shut off, the current 410 stops, of course. As a result, the current sense signal 414 will drop accordingly. However, because of the operation of the thyristor 422, the thyristor 422 will continue to conduct, holding the node between the thyristor 422 and resistor 424 low, which results in the series switch transistor 404 staying shut off. In order to reset the thyristor 422, the battery voltage must be disconnected, ceasing the flow of current though the thyristor 422.

It will be appreciated by those skilled in the art that the circuit of FIG. 4 is an example of an active bias circuit 428, and that circuits that achieve similar function can be realized using different components, such as, for example bipolar junction transistors instead of the P-type and N-type latching MOSFETs 430, 436. Likewise, other types of latching circuits can be used as alternative to the thyristor 422 that provide an equivalent function performed by the thyristor 422. Furthermore, it will be appreciated by those skilled in the art that the particular resistor values for the various resistor (e.g. 424, 426, 434, 438) can depend on the particular application and the design considerations for the particular application, and that decoupling or debounce type capacitors can be added in order to prevent noise from interfering with operation of the active bias circuit 428, as is known.

Figure 5:
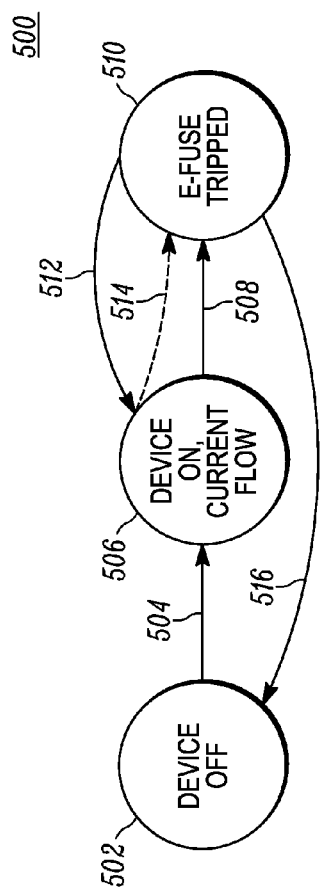
FIG. 5 is a state diagram of an electronic fuse circuit in accordance with some embodiments.

FIG. 5 is a state diagram 500 of an electronic fuse circuit in accordance with some embodiments. The state diagram 500 can describe exemplary operation of an electronic fuse circuit such as that shown in FIGS. 1-4. In an initial state 502 the device in which the electronic fuse is disposed is turned off, but the battery is connected and the latching action of the active bias circuit has not been triggered. Accordingly the series switch transistors are on. The initial state 502 can transition to an operational state 506 by turning the device on 504, and current is provided to the audio amplifier circuit. In the operational state 506 the series switch transistors of the two electronic fuse circuits are on. In the event of a fault or other high current condition 508, the state transitions to a fault state 510 where one of the electronic fuse circuits has tripped, causing it to turn off its series switch transistor. The only way out of the fault state 510 is by disconnecting and reconnecting the battery as indicated by transitions 512 and 516. In transition 512 the state can be returned to the on state 506 upon disconnecting and reconnecting the battery, assuming the device does not also shut down and require being manually switched on, as is the case for transition 516. If the state transitions back to the initial state 502, the fault may or may not be present, but the power to the electronic fuse circuits may not be on due to a switch (e.g. switch 214) being reset to off as a result of the battery being disconnected. If the fault is still present when the state transitions from the fault state to the on state, or to the initial state when the device is turned on, the state will transition immediately back to the fault state 510 as indicated, for example, by transition line 514.

Figure 6:
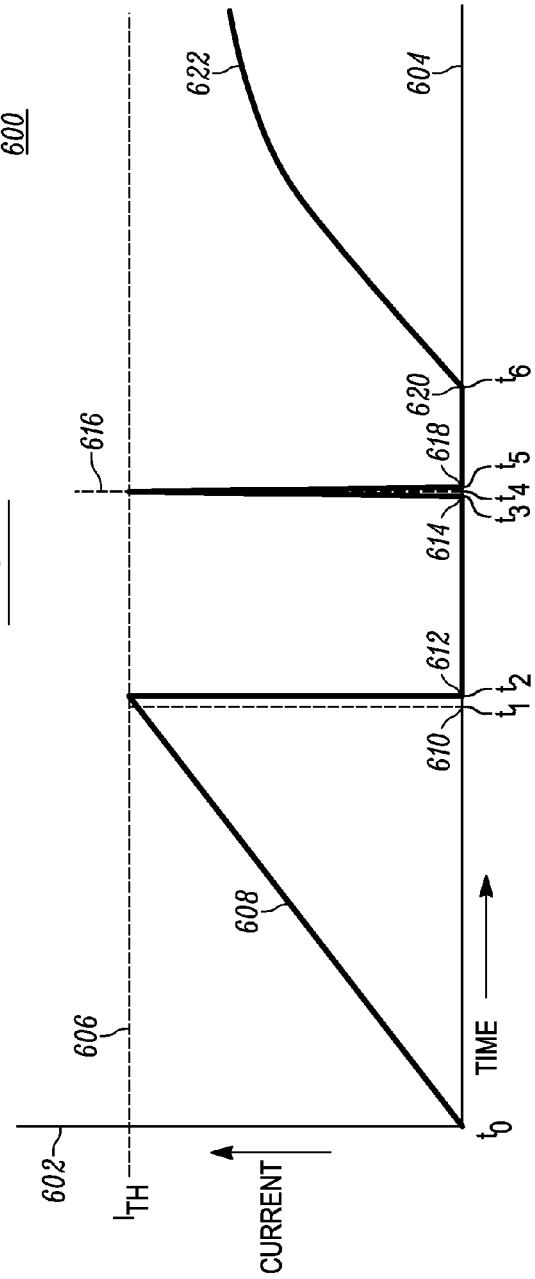
FIG. 6 is a graph chart diagram illustrating examples of operation of an electronic fuse circuit in accordance with some embodiments.

FIG. 6 is a graph chart 600 illustrating examples of operation of an electronic fuse circuit such as that shown in FIGS. 1-4, in accordance with some embodiments. The vertical axis 602 represents current through the current sense resistor and series switch transistor, and the horizontal axis 604 represents time. A dashed horizontal line 606 represent the current threshold that has been established as the maximum actual current that can be sourced to the audio amplifier circuit based on specific design factor, including the inductance of the speaker or speakers being driven by the audio amplifier circuit.

Starting at the origin, at time $t_0$, the current 608 begins to rise. This does not represent operation of the audio amplifier circuit, rather, this is an example to show the effect of the operation of the electronic fuse circuit. As such, current 608 can in increased over time to time $t_1$ 610 by, for example, decreasing the resistance of a load connected at the output of the electronic fuse. At time 610, the current 608 has reached the current threshold 606, causing the electronic fuse circuit to shut off, hence, at time $t_2$ 612 the current drops to zero. From 612 to 614 the load may or may not be removed, but the battery remains connected, so the electronic fuse remains off, and no current flows through the electronic fuse circuit.

At time 614 ($t_3$), the battery is reconnected after having been disconnected, and the electronic fuse circuit is reset, but the fault condition is still present. As a result, the current rises rapidly to the current threshold 606 at time $t_4$ 616, which trips the electronic fuse circuit, causing it to cease conduction and the current falls back to zero at time $t_5$ 618. Then at time $t_6$ 620, the battery is again reconnected, resetting the electronic fuse circuit, and current 622 begins to gradually rise without reaching the current threshold 606, and the electronic fuse circuit is not tripped.

Accordingly, embodiments such as those exemplified herein provide the benefit of eliminating the conventional resistive fuses in series between the audio power amplifier output and the speaker being driven by the audio power amplifier for intrinsically safe operation. The fuse action is instead provided between the battery and the power input of the audio power amplifier(s) with an electronic fuse circuit. The electronic fuse circuit, being actively driven, responds quickly to an overcurrent condition, shutting off current, and latching so as to keep the electronic fuse turned off until it is reset by removing and reconnecting the battery. By eliminating the resistive fuses of prior art intrinsically safe designs, more audio power can reach the speaker, allowing for a louder acoustic output that is comparable with radio devices of a similar design that may not have intrinsically safe features.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. An intrinsically safe audio power circuit for a portable radio device comprising:
    an audio amplifier circuit having a power input; and
    first and second electronic fuse circuits coupled in series between the power input of the audio amplifier circuit and an unregulated battery positive source;
    wherein each of the first and second electronic fuse circuits comprises:
        a current sense portion that produces a current sense signal proportional to a current supplied to the audio amplifier circuit from the unregulated battery positive source;
        a series switch transistor that is in series between the unregulated battery positive source and the audio amplifier circuit; and
        a driver circuit that is responsive to the current sense signal which drives and holds the series switch transistor off when the current sense signal reaches a current threshold.

2. The intrinsically safe audio power circuit of claim 1, wherein the audio power amplifier circuit comprises a class D amplifier having an audio output coupled to an internal speaker of the portable radio device.

3. The intrinsically safe audio power circuit of claim 1, wherein the audio power amplifier circuit comprises a class AB amplifier having an audio output coupled to an external speaker line of the portable radio device.

4. The intrinsically safe audio power circuit of claim 1, further comprising a resistive fuse coupled in series with the first and second electronic fuse circuits between the first and second electronic fuse circuits and the unregulated battery positive source.

5. The intrinsically safe audio power circuit of claim 4, further comprising a power switch coupled in series between the resistive fuse and the first and second electronic fuse circuits.

6. The intrinsically safe audio power circuit of claim 1, wherein the driver circuit is reset by disconnecting the unregulated battery positive source from the intrinsically safe audio circuit.

7. The intrinsically safe audio circuit of claim 1, wherein the driver circuit comprises: a driver comparator that compares the current sense circuit to a reference voltage corresponding to the current threshold, and provides an output an active bias circuit that control a bias of the series switch transistor responsive to the output of the driver comparator.

8. The intrinsically safe audio circuit of claim 1, wherein the audio amplifier circuit and the first and second electronic fuse circuits are encapsulated in an encapsulant material.

9. An intrinsically safe portable two-way radio device comprising:
    an audio amplifier circuit having a power input;
    an audio processor including a digital section that provides an audio signal to the audio amplifier circuit to be amplified by the audio amplifier circuit; and
    first and second electronic fuse circuits coupled in series between the power input of the audio amplifier circuit and an unregulated battery positive source, wherein each of the first and second electronic fuse circuits allow conduction of a supply current from the unregulated battery positive source to the power input of the audio amplifier circuit while the supply current is below a current threshold, and which shut off when the supply current exceeds the current threshold, and upon shutting off, the first and second electronic fuse circuit latch so as to remain off until they are reset.

10. The intrinsically safe portable two-way radio of claim 9, wherein the audio power amplifier circuit comprises a class D amplifier having an audio output coupled to an internal speaker of the portable radio device.

11. The intrinsically safe portable two-way radio of claim 9, wherein the audio power amplifier circuit comprises a class AB amplifier having an audio output coupled to an external speaker line of the portable radio device.

12. The intrinsically safe portable two-way radio of claim 9, further comprising a resistive fuse coupled in series with the first and second electronic fuse circuits between the first and second electronic fuse circuits and the unregulated battery positive source.

13. The intrinsically safe portable two-way radio of claim 12, further comprising a power switch coupled in series between the resistive fuse and the first and second electronic fuse circuits.

14. The intrinsically safe portable two-way radio of claim 9, wherein each of the first and second electronic fuse circuits comprises:
- a current sense portion that produces a current sense signal proportional to a current supplied to the audio amplifier circuit from the unregulated battery positive source;
- a series switch transistor that is in series between the unregulated battery positive source and the audio amplifier circuit; and
- a driver circuit that is responsive to the current sense signal which drives and holds the series switch transistor off when the current sense signal reaches a current threshold.

15. The intrinsically safe portable two-way radio of claim 14, wherein the driver circuit is reset by disconnecting the unregulated battery positive source from the intrinsically safe audio circuit.

16. The intrinsically safe portable two-way radio of claim 15, wherein the driver circuit comprises:
- a driver comparator that compares the current sense circuit to a reference voltage corresponding to the current threshold, and provides an output
- an active bias circuit that control a bias of the series switch transistor responsive to the output of the driver comparator.

17. The intrinsically safe portable two-way radio of claim 9, wherein the audio amplifier circuit and the first and second electronic fuse circuits are encapsulated in an encapsulant material.

18. A method of operating an electronic fuse circuit in an intrinsically safe device, the method comprising:
- sensing a supply current provided from a battery to an audio amplifier circuit in a pair of redundant electronic fuse circuits connected in series between the battery and a power input of the audio power amplifier circuit;
- detecting the supply current exceeding a current threshold in one of the redundant electronic fuse circuits, wherein the current threshold is set as an intrinsically safe level based on an electrical property of a speaker driven by the audio amplifier circuit;
- responsive to detecting the supply current exceeding the current threshold, opening a series switch transistor of the electronic fuse circuit that detected the supply current exceeding the current threshold, wherein opening the series switch transistor is performed using an active bias circuit; and
- latching the active bias circuit to maintain the series switch transistor off.

19. The method of claim 18, further comprising resetting the active bias circuit by disconnecting the battery from the intrinsically safe device and reconnecting the battery to the intrinsically safe device.

20. The intrinsically safe audio power circuit of claim 1, wherein the audio power amplifier circuit comprises:
- a first class of audio power amplifier having an audio output coupled to an internal speaker of the portable radio device; and
- a second class of audio power amplifier, different from the first class of audio power amplifier, the second class of audio power amplifier having an audio output coupled to an external speaker line of the portable radio device.

21. The intrinsically safe portable two-way radio of claim 9, wherein the audio power amplifier circuit comprises:
- a first class of audio power amplifier having an audio output coupled to an internal speaker of the portable two-way radio device; and
- a second class of audio power amplifier, different from the first class of audio power amplifier, the second class of audio power amplifier having an audio output coupled to an external speaker line of the portable two-way radio device.

* * * * *